United States Patent [19]

Ip et al.

[11] Patent Number: 4,725,984

[45] Date of Patent: Feb. 16, 1988

[54] CMOS EPROM SENSE AMPLIFIER

[75] Inventors: William W. Ip, San Jose; Gust Perlegos, Fremont, both of Calif.

[73] Assignee: Seeq Technology, Inc., San Jose, Calif.

[21] Appl. No.: 581,684

[22] Filed: Feb. 21, 1984

[51] Int. Cl.[4] .................... G11C 7/00

[52] U.S. Cl. .................... 365/189; 365/185; 365/210

[58] Field of Search .................... 365/210, 184, 185, 189, 365/203, 205, 207, 208

[56] References Cited

U.S. PATENT DOCUMENTS

| | | | |
|---|---|---|---|
| 4,094,008 | 6/1978 | Lockwood et al. | 365/210 |
| 4,179,626 | 12/1979 | Oehler | 365/207 |
| 4,223,394 | 9/1980 | Pathak et al. | 365/210 |
| 4,301,518 | 11/1981 | Klaas | 365/207 |
| 4,342,102 | 7/1982 | Puar | 365/210 |
| 4,434,479 | 2/1984 | Chen et al. | 365/210 |
| 4,459,497 | 7/1984 | Kuo et al. | 365/208 |
| 4,464,591 | 8/1984 | Rapp | 365/208 |
| 4,494,219 | 1/1985 | Tanaka et al. | 365/207 |

*Primary Examiner*—Stuart N. Hecker
*Assistant Examiner*—Glenn A. Gossage
*Attorney, Agent, or Firm*—Lyon & Lyon

[57] ABSTRACT

Individual CMOS floating-gate memory cells capable of storing data are arranged in an array structure and selected with horizontal and vertical access lines. Current flow through the array cells is measured, amplified, and then compared with an unprogrammed cell using the sense amplifier of the present invention. The sense amplifier tolerates increased variation in the characteristics of programmed or unprogrammed cells and therefore increases the manufacturing yields of the arrays. It additionally achieves fast accessing and sensing of the stored data.

1 Claim, 2 Drawing Figures

FIG. 2

CMOS EPROM SENSE AMPLIFIER

FIELD OF THE INVENTION

This invention relates to a device for reading the state of an NMOS EPROM memory cell. More specifically, it relates to a device for measuring the current flow through a floating-gate memory cell, amplifying this current, and comparing it with an unprogrammed reference cell to yield a proper read-out result.

BACKGROUND OF THE INVENTION

Memory devices are generally used to store data for computer operations. Because memory is so critical in computer operations, it is generally desirable to use memory devices which store large amounts of data and can be accessed very quickly. One way this can be done is by fabrication of semiconductor devices to store data which can then be accessed by a computer processing device.

One kind of memory device which has proved useful is the electrically programmable read-only memory (EPROM). This is a semiconductor memory which can be "programmed," and which can be accesed by a computer processing device during read operations. EPROM's are particularly attractive in storage applications where non-volatility is desired. Non-volatility is a feature which allows the EPROM's to remember the data stored in the memory device even after power to the memory device is lost. Non-volatility is achieved through the use of "floating-gate" transistors to construct individual data cells in the EPROM memory array. The amount of charge held in the floating gate of an EPROM cell differs depending upon whether the cell is programmed or unprogrammed. Inasmuch as the electrical characteristics of the cell are determined by the amount of charge in the gate, sensing of the cell electrical characteristics can serve as an indication of the programming state of the cell.

When constructing memory devices which have a large number of memory cells, one difficulty which has arisen is that smaller and more closely packed devices are more difficult to fabricate and their characteristics are more difficult to control. Each time a memory array is manufactured, large variations in the memory cell characteristics can result, making it difficult to anticipate the actual current flow through individual memory cells during reading of the cell state.

Therefore, it is an object of the present invention to improve the yield on production of high performance EPROM memory chips by allowing for greater variation in EPROM memory cell characteristics caused by variation in the cell manufacturing process.

It is a second object of the present invention to achieve a fast sensing of the state of an EPROM memory cell.

These and other objects of the present invention will be more clearly understood from an examination of the specification, the drawings, and the accompanying claims.

SUMMARY OF THE INVENTION

Memory cells are constructd from "floating gate" transistors which can be programmed, permitting the cells to store either a zero-bit or a one-bit. These memory cells are arranged in an array of rows and columns; a row-select line and a column-select line are used to select an individual memory array cell for sensing. When a memory array cell is selected, the "floating gate" will either permit or prevent current flow through the cell depending upon whether a zero or one bit has been stored in the gate. This current can then be amplified and sensed.

With each memory array cell selected, a reference cell is also selected. Reference cells always conduct current and will always display a known behavior. The current which is conducted by the memory array cell is amplified by a transistor pair, and the result compared with the current which is conducted by the reference cell. The result will indicate that the memory array cell conducted current if its amplified current exceeds the current for the reference cell, thus allowing for partially programmed memory cells.

Special circuitry is used to assure that the memory array cells are operated in a favorable voltage range by charging the excess capacitance of the memory array columns for the duration of the read operation. This same special circuitry is used to assure that voltage levels are balanced between the memory array cell's region and the reference cell's region of the chip. Latch circuitry is used to assure that the row select operation is performed as fast as possible.

DETAILED DESCRIPTION OF THE INVENTION

Figures 1, 2:
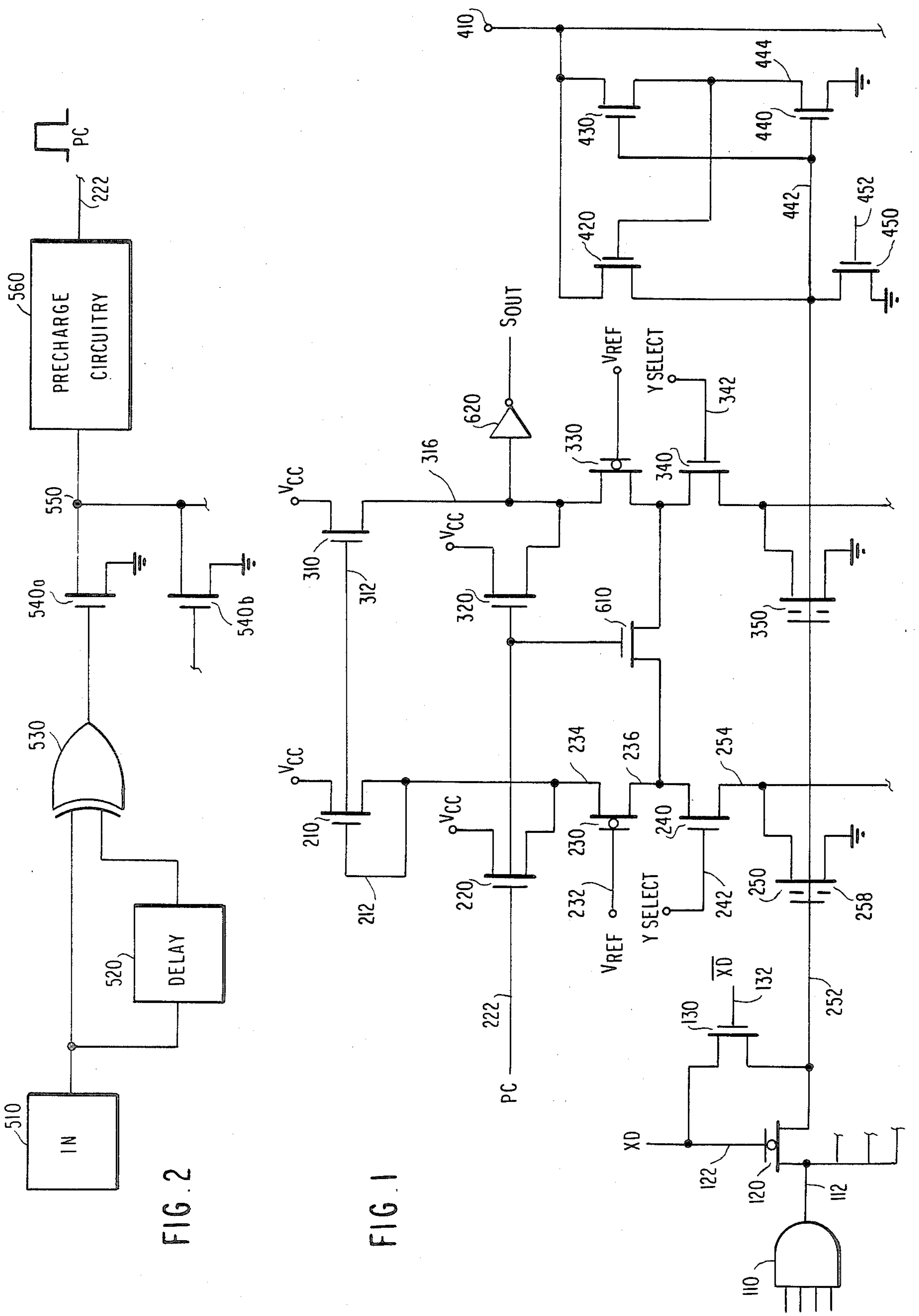
FIG. 1 is a schematic of the sense amplifier.
FIG. 2 is a schematic of the pre-charge circuit.

Referring now to FIG. 1, the sense amplifier circuit is depicted. In this diagram, transistors are generally N-channel filed-effect transistors (FETs) with a threshold of about 1.0 volts; transistors labelled "P" are P-channel FETs; transistors labelled with a small bubble have a threshold of about 0 volts; transistors labelled with a broken internal line are programmable "floating gate" FETs.

The memory cells are arranged in an array of rows, columns, and planes. Each plane provides a single one-bit output from the memory, so the arrangement into 8 planes allows a single 8-bit byte to be read out at once. Within each plane, the cells are arrayed in 64 columns by 512 rows; individual cells are thus addressed by row and column.

Row addressing is performed by taking a 9-bit row address (thus 512 possibilities) and breaking it up into fields. Bits 1-2 are demultiplexed into 4 "group A" outputs (not shown); bits 3-4 are demultiplexed into 4 "group B" outputs (not shown); and bits 5-7 are demultiplexed into 8 "group C" outputs (not shown). A single line from each of the group A, B, C, outputs is drawn to each row of the array and selection performed by an AND gate 110.

Note that the output of the AND gate 110 is only high (true) if all its inputs are high, i.e., this particular row is selected by the row-address. Inverters on each AND gate assure that each row is selected only by its own row-address and by no other. The output of the AND gate 112 is ultimately used to drive four "word-lines" 252, so the remaining two bits of the row-address must be used to post-decode the row-address value.

The remaining two bits of row-address, bits 8-9, are demultiplexed into 4 "XD" outputs (not shown); the result and its inverse are drawn to each row of the array as the lines XD 122 and XD-bar 132. The XD line controls transistor 120, which if XD is high will turn on, allowing the word-line 252 to charge and enable the memory cells on this row. Note, that both the AND gate's output 112 and the XD line 122 must be on simultaneously for the row to be selected. The XD-bar line is used to discharge the word-line 252; when XD is low, and therefore the row is no longer selected, transistor 130 will turn on, allowing the word-line to discharge.

Each cell in the memory array is selected not only by row but also by column. Each plane of the array contains 64 columns of "array cells," ordinary memory cells which may be programmed to contain either a zero-bit or a one-bit. Each plane also has a single column of "reference cells," memory cells which have been deliberately left unprogrammed, so they will always conduct current.

The array column is selected with the Y-select line 242; when this line is high transistor 240 will turn on, and the array column will be able to draw current from the array cell. If the Y-select line is low, transistor 240 will not turn on, and the column will be effectively disabled. In a presently preferred embodiment of the invention, the Y-select line 242 as shown is replaced with a pair of Y-select lines, 242*a* and 242*b*, the first of which is used to select groups of 4 array columns using bits 1-4 of the column-address, and the second of which is used to select a single array column within the group of 4 using bits 5-6 of the column-address. This method is preferred because it only requires 20 lines to be drawn on the chip, rather than 64 (one for each column).

The reference column, in contrast, is always selected when a read operation is in progress. The reference-select line 342 is high when the read is started, causing transistor 340 to turn on and the reference column to be selected just like the array column.

Data is recorded in the array cell by programming the floating gate 258 in the transistor 250. If the floating gate has not been filled with charge-carriers, it will have a threshold voltage of about 1.0 volt, and thus will turn on when V/cc (about 5.0 volts) is applied to the word-line 252. If the floating gate has been charged with negative carriers (e.g., electrons), it will have a threshold voltage of over 6.0 volts, and thus will not turn on when a voltage is applied to the word-line.

When the word-line 252 is triggered, the array cell 250 will respond; it will turn on if it is unprogrammed and it will not turn on if it has been programmed. If the array cell is turned on, it will draw current from the array column, and the voltage at node 254 will drop slightly. This voltage drop will be propagated across transistor 240, since the array colummn has been selected with the Y-select line 242, to transistor 230.

Transistor 230 is specified to conduct a large current in response to a small change in voltage. When the array cell 250 is turned on, it will cause a voltage drop at node 254 of about 100–200 millivolts; this will be propagated to transistor 230, which will conduct a noticeable current across to node 234. It is necessary to use a large transistor so that small changes in column voltage will be registered quickly.

The voltage v/ref 232 (about 2 volts) is used to bias the memory cell 250 so that is operates in its linear region. This voltage is used because operation of the array column memory cell in the region around 2 volts is preferred. Too large a bit-line voltage would cause undesirable shift in the threshold voltage of the memory cell over time (via "hot electron injection"), while too small a bit-line voltage would produce only a slow and weak response.

Since operation of the array cell in the region around 2 volts is desired, it is necessary to assure that the array column is charged to that voltage. Each memory cell has a small degree of capacitance, and the accumulated capacitance of the entire column is sufficient to slow down charging of the column at the beginning of each read. If this were allowed to occur, transistor 230 would turn on (due to a voltage drop between nodes 232 and 236) at every read, and the sense-amp would respond more slowly than desired.

To account for this problem, a "pre-charge" (PC) pulse is generated on each read to charge the column capacitance up to the desired 2 volts. The pulse is fairly short, about 40 nanoseconds wide, and is input to line 222, the gate of transistor 220. This causes transistor 220 to conduct current from v/cc to the array column and charge the column to the desired voltage.

The pre-charge pulse is also used to equalize the voltages between the array column and the reference column at the start of the read operation. Since these two groups of transistors can be quite far away from each other on the chip, voltage differences may develop which would slow the sensing operation. The pre-charge pulse, when triggered, also turns on transistor 610 to balance the two voltages on the array and reference columns. After the pre-charge pulse is over, transistors 220 and 610 will turn off.

At this point the cell current will be transmitted from the memory cell 250 (which will either conduct current or not), through the column-select transistor 240 and the v/ref transistor 230 to node 234. Transistor 210 is arranged with its gate and drain connected to node 234 as shown. When the memory cell conducts current, this current is drawn from the array column and the voltage at node 234 will drop to about 2.5 volts (which is close to $V_{ref}$). When the memory cell does not conduct any current, the voltage at node 234 will remain close to v/cc (about one transistor drop difference) and will be much higher than v/ref; it will typically be about 4 volts. This gate voltage of transistor 210 also appears on the gate of transistor 310 in the reference column. Since the gates of transistors 210 and 310 are tied together, transistors 210 and 310 operate in tandem, but transistor 310 is three times larger than transistor 210, so it will attempt to conduct up to three times the current which was conducted in the array column. This current flow is conducted from v/cc to node 316.

The reference column is constructed very similarly to the array column, and so it will draw about the same current as the array column will. When transistor 310 attempts to supply the large amount of current which it is capable of, voltage will build up on node 316 and that node will be high; alternately, when transistor 310 is conducting only a little current (i.e., when transistor 250 is off), voltage on node 316 will be drained away by the rest of the reference column and that node will be low. Node 316's value is reported out by the sense-amp through inverter 620.

In parallel to the configuration of the array column, each word-line 252 also drives a reference cell 350, which is always unprogrammed and thus always conducting current at the word-line's voltage. When the word-line voltage is raised the reference cell will always turn on and proceed to conduct current on the reference column just like the array cell would conduct current on the array column if the array cell were on.

This current will be propagated across transistor 340, which is always selected when a read operation is in progress, and across transistor 330, whose operation is identical to transistor 230 of the array column. The reference column's 2 volt bias is also set with the pre-charge pulse, just like the array column, using transistor 320. The current is propagated to the top of the reference column, node 316, where the memory cell data bit is reported.

Due to the amplification which transistors 210 and 310 perform, the sense-amp will properly sense memory cells which are partially programmed as well as memory cells which are working perfectly. If the array cell is conducting slightly more than $\frac{1}{3}$ of the current which it should normally be conducting, the amplification effect will cause it to be reported as if it were conducting a normal current.

This effect is due to the ability of transistor 310 to conduct up to three times the current which is conducted on the array column. If the array cell's current is even slightly more than $\frac{1}{3}$ of normal, transistor 310 will still attempt to conduct slightly more current than the reference column can sink, and node 316 will report as if the cell is working normally, though it may be slower in its report, due to slower charging.

The latch circuit is not strictly necessary for the sense-amp, but it is used to speed the sensing operation. When the word-line transitions from a low voltage to a high voltage, it will take some time before it passes the threshold voltage of the floating gate memory cells. This time will be reflected in the time which the sense-amp takes to read out a proper value.

The latch is set when the word-line 252 is raised above 1.5 volts. This raises node 442, causing transistor 440 to turn on. When transistor 440 is turned on, line 444 will be driven low. In turn, this causes transistor 420 to turn on (since it is a P-channel transistor and works opposite from N-channel transistors), and allows current to flow from the voltage source 410 to the word-line.

Thus, raising the word-line 252 sets the latch. This has the benefical effect of raising the word-line voltage much more quickly than would otherwise be the case without the operation of the latch.

During read operations, the voltage source 410 is set to v/cc. No programming of the floating-gate cells occurs, but the response time of the sense-amp is improved by speeding up the rise time of the word-line 252. The latch can also be used for programming operations by setting the voltage source to v/mult (about 17 volts). This voltage will appear across the gate of the array cell and program it. With reference to this operation see our co-pending application, Ser. No. 582,025 filed on Feb. 21, 1984, hereby incorporated by reference.

The latch is cleared when the pre-charge pulse from the next memory access occurs. The next access pre-charge pulse is input to node 452, causing transistor 450 to turn on. When transistor 450 is turned on, the word-line will be connected to ground via transistor 450 and will discharge, becoming low. In turn, this causes transistor 430 to turn on (since it is a P-channel transistor), and allows current to flow from the voltage source 410 to node 444, and the word-line will remain grounded.

Referring now to FIG. 2, the pre-charge circuit is depicted. Each input address bit is attached to an in-pad 510. The bit from the in-pad is used, along with an echo of itself (created by an RC delay circuit 520), to an XOR (exclusive or) gate 530. Since any value exclusive or-ed with itself yields a zero, the XOR gate will create a positive pulse when the address bit changes.

The result from each address change is input to the gate of a transistor 540, which will pull node 550 low if there is a pulse. The set of transistors 540 performs a logical NOR operation, creating a single positive pulse each time at least one of the input address bits changes. The pre-charge output stage 560 smooths these negative pulses and extends them to about 40 nanoseconds for use as pre-charge (PC) pulses in the sense-amp read operation.

Those skilled in the art will recognize that while a preferred embodiment has been disclosed, variations are possible without departing from the intended scope of the present invention.

We claim:

1. A circuit for sensing a memory cell value, comprising:

(a) a first floating gate transistor programmed with a memory data value, whose gate is electrically connected to a select line and whose drain is electrically connected to ground;

(b) a first field effect transistor whose gate and drain are electrically connected to the source of said first floating gate transistor and whose source is electrically connected to a voltage source;

(c) a second floating gate transistor programmed with a reference data value, whose gate is electrically connected to the gate of the first floating gate transistor and whose drain is electrically connected to ground;

(d) a second field effect transistor whose gate is electrically connected to the gate of said first field effect transistor and whose source is electrically connected to a voltage source and whose drain is electrically connected to the source of said second floating gate transistor;

whereby the voltage appearing at the node between said second floating gate transistor and said second field effect transistor is indicative of the data stored in said first floating gate transistor.

* * * * *